(12) United States Patent
Park et al.

(10) Patent No.: US 11,392,023 B2
(45) Date of Patent: Jul. 19, 2022

(54) METHOD OF DESIGNING A MASK AND METHOD OF MANUFACTURING A SEMICONDUCTOR DEVICE USING THE SAME

(71) Applicant: Samsung Electronics Co., Ltd., Suwon-si (KR)

(72) Inventors: Kyungjae Park, Suwon-si (KR); Moojoon Shin, Hwaseong-si (KR); Jongsu Park, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 284 days.

(21) Appl. No.: 16/821,193

(22) Filed: Mar. 17, 2020

(65) Prior Publication Data

US 2021/0018830 A1    Jan. 21, 2021

(30) Foreign Application Priority Data

Jul. 19, 2019 (KR) .................. 10-2019-0087692

(51) Int. Cl.
*G03F 1/36* (2012.01)
*G03F 7/20* (2006.01)
*G03F 1/70* (2012.01)

(52) U.S. Cl.
CPC ............. *G03F 1/36* (2013.01); *G03F 7/2002* (2013.01); *G03F 1/70* (2013.01); *G03F 7/70441* (2013.01)

(58) Field of Classification Search
CPC . G03F 1/36; G03F 1/70; G03F 7/2002; G03F 7/70441
USPC ................................. 430/5, 22, 30
See application file for complete search history.

(56) References Cited

U.S. PATENT DOCUMENTS

| | | |
|---|---|---|
| 8,201,110 B1 | 6/2012 | Gu et al. |
| 8,392,854 B2 | 3/2013 | Kim et al. |
| 8,694,927 B2 | 4/2014 | Jeong |
| 8,788,983 B2 | 7/2014 | Zhang |
| 9,383,638 B2 | 7/2016 | Ishii |
| 9,563,738 B2 | 2/2017 | Chen et al. |
| 10,170,495 B2 | 1/2019 | Kim et al. |
| 2005/0204322 A1 | 9/2005 | Kotani et al. |
| 2007/0074146 A1 | 3/2007 | Tanaka et al. |
| 2008/0148218 A1 | 6/2008 | Kawakami et al. |
| 2008/0250383 A1 | 10/2008 | Tanaka et al. |

FOREIGN PATENT DOCUMENTS

| | | |
|---|---|---|
| JP | 2007-086586 A | 4/2007 |
| JP | 4473555 B2 | 6/2010 |
| JP | 4488727 B2 | 6/2010 |

*Primary Examiner* — Christopher G Young
(74) *Attorney, Agent, or Firm* — Harness, DIckey & Pierce, P.L.C.

(57) ABSTRACT

A method of manufacturing a semiconductor device includes forming a lower structure including first repetitive patterns, and forming an upper structure including forming second repetitive patterns to correspond to each of the first repetitive patterns on the lower structure, and the forming second repetitive patterns includes preparing a design layout for the second repetitive patterns, forming a first correction layout including corrected second repetitive patterns by performing optical proximity correction (OPC) on the design layout, forming a second correction layout by performing position correction on the first correction layout to move a position of the corrected second repetitive patterns to correspond to a changed position of the first repetitive patterns according to physical deformation of the lower structure, manufacturing a mask using the second correction layout, and patterning a photoresist layer using the mask.

20 Claims, 19 Drawing Sheets

METHOD OF DESIGNING A MASK AND METHOD OF MANUFACTURING A SEMICONDUCTOR DEVICE USING THE SAME

CROSS-REFERENCE TO RELATED APPLICATION(S)

This application claims benefit of priority to Korean Patent Application No. 10-2019-0087692 filed on Jul. 19, 2019 in the Korean Intellectual Property Office, the disclosure of which is incorporated herein by reference in its entirety.

BACKGROUND

1. Field

The present inventive concepts relate to mask design methods and methods of manufacturing semiconductor devices using the same.

2. Description of Related Art

In the design of an integrated circuit, to form a circuit on a semiconductor substrate, a layout of a circuit is prepared, and the layout may be transferred to a wafer surface through a mask, such as a photomask. As a semiconductor device becomes highly integrated, integrated circuit design becomes more complex. Accordingly, it is becoming increasingly important to accurately implement a layout according to an originally intended design on a mask required for a lithography process. Particularly, as a wavelength of a light source used in exposure equipment approaches a feature size of a semiconductor device, a distortion phenomenon of a pattern may occur due to diffraction, interference, and the like, of beams. Accordingly, on a wafer, an optical proximity effect (OPE) may occur, in which an image having a shape different from an original shape falls or distortion of a pattern shape is caused by an influence of an adjacent pattern. In order to prevent a problem such as a dimensional variation according to an optical proximity effect, an optical proximity correction (OPC) process is performed. The OPC process is provided to predict a dimensional variation in advance when a pattern is transferred and to deform a design pattern in advance so as to obtain a pattern shape according to a layout after the pattern is transferred.

SUMMARY

An aspect of the present inventive concepts is to provide mask design methods with improved accuracy and efficiency and methods of manufacturing semiconductor devices using the same.

According to an aspect of the present inventive concept, a method of manufacturing a semiconductor device includes forming a lower structure including first repetitive patterns, and forming an upper structure including forming second repetitive patterns to correspond to each of the first repetitive patterns on the lower structure, and the forming second repetitive patterns includes preparing a design layout for the second repetitive patterns, forming a first correction layout including corrected second repetitive patterns by performing optical proximity correction (OPC) on the design layout, forming a second correction layout by performing position correction on the first correction layout to move a position of the corrected second repetitive patterns to correspond to a changed position of the first repetitive patterns according to physical deformation of the lower structure, manufacturing a mask using the second correction layout, and patterning a photoresist layer using the mask.

According to an aspect of the present inventive concept, a method of manufacturing a semiconductor device includes preparing a design layout including repetitive patterns and non-repetitive patterns, forming a first correction layout including corrected repetitive patterns by performing first optical proximity correction (OPC) on the repetitive patterns, forming a second correction layout by performing first position correction on the first correction layout to move a position of the corrected repetitive patterns, performing second optical proximity correction (OPC) on the non-repetitive patterns using a method different from the first optical proximity correction, and performing second position correction on the non-repetitive patterns to move a position of the non-repetitive patterns.

According to an aspect of the present inventive concept, a mask design method includes preparing a design layout including second repetitive patterns formed to match first repetitive patterns, forming a first correction layout including corrected second repetitive patterns, by performing optical proximity correction (OPC) on the design layout, forming a second correction layout by performing position correction on the first correction layout to move a position of the corrected second repetitive patterns to correspond to a change in position of the first repetitive patterns, and providing the second correction layout to exposure equipment.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, the example embodiments of the present disclosure will be described in detail with reference to the attached drawings.

Figure 1:
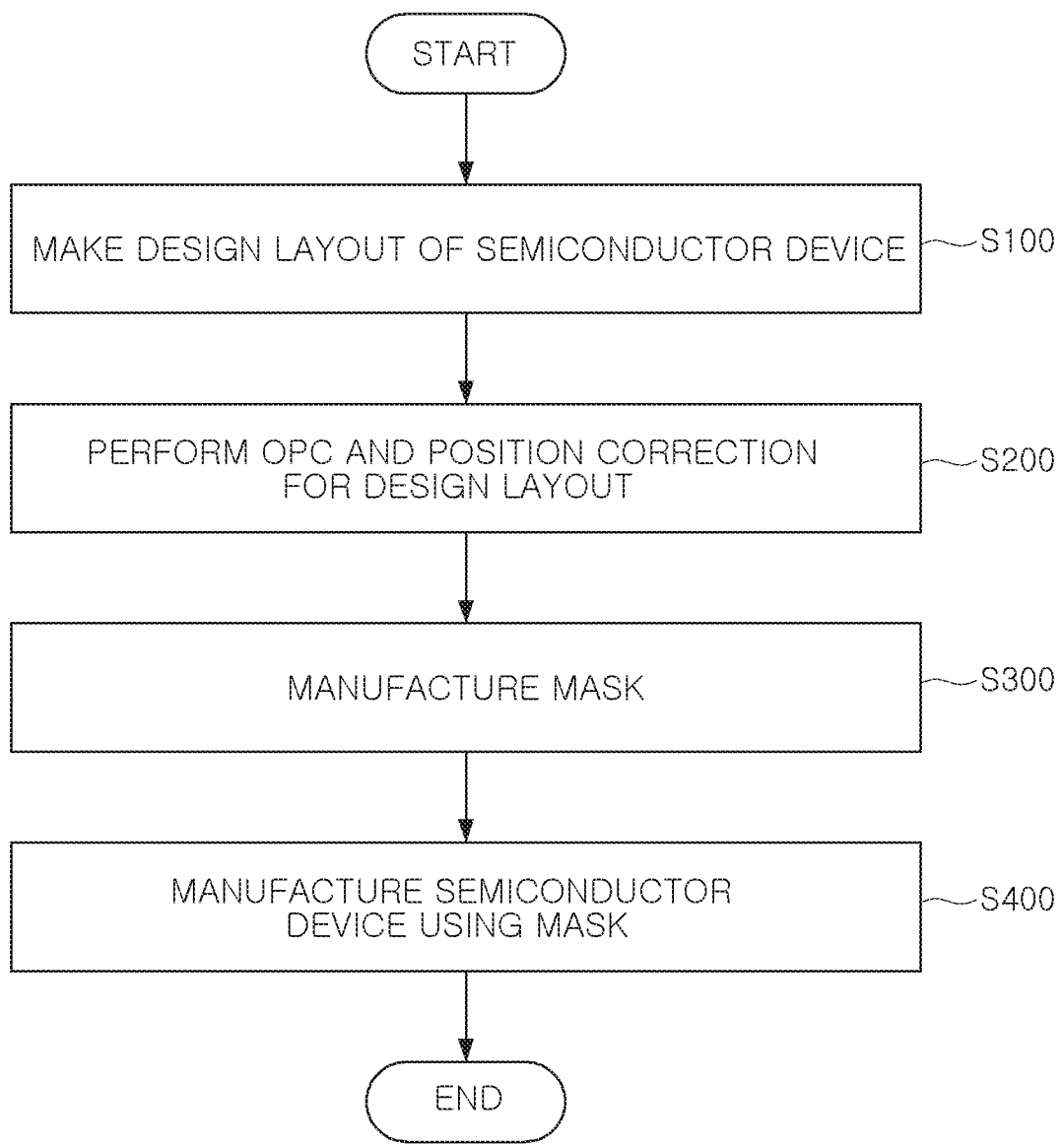
FIG. 1 is a flow diagram illustrating a method of manufacturing a semiconductor device according to example embodiments.

FIG. 1 is a flow diagram illustrating a method of manufacturing a semiconductor device according to example embodiments.

Referring to FIG. 1, a method of manufacturing a semiconductor device may include designing of a design layout of a semiconductor device (S100), performing of optical proximity correction (OPC) and position correction for the design layout (S200), manufacturing of a mask using the corrected design layout (S300), and manufacturing of a semiconductor device using the mask (S400).

In the designing of a design layout of a semiconductor device (S100), a design layout corresponding to a circuit pattern of a semiconductor device to be formed on a wafer may be provided from a host computer, a server of a semiconductor manufacturing facility, or other suitable method. In detail, the layout is a physical indication in which a circuit designed for a semiconductor device could be transferred onto a wafer, and may include a plurality of patterns. For example, the design layout may be provided from a coordinate value of an outline of patterns forming the design layout from a CAD system. In detail, the patterns may include repetitive patterns in which the same shape is repeated, and the patterns may be provided in the form of a combination of polygons such as a triangle and/or a quadrangle.

The performing of optical proximity correction (OPC) and position correction for a design layout (S200) may include optical proximity correction and position correction, each performed in a separate operation.

First, the optical proximity correction refers to correction of changing patterns included in the design layout by reflecting an error according to the optical proximity effect (OPE). As a pattern is finer, an optical proximity phenomenon may occur due to influence between neighboring patterns during an exposure process. Thus, by performing optical proximity correction to correct the design layout, occurrence of the optical proximity effect may be suppressed. For example, the optical proximity correction may include expanding an overall size of the patterns forming the design layout and processing a corner portion. For example, the optical proximity correction may include moving edges of each pattern or adding additional polygons. Due to the optical proximity correction, a distortion phenomenon of a pattern, caused by diffraction, interference, and the like, of beams generated during exposure, is corrected, and an error caused by pattern density may be corrected. After the optical proximity correction, optical proximity correction verification may further be performed.

The position correction may include moving a position of the pattern on which the optical proximity correction is performed in consideration of physical transformation and change of a lower structure in which the patterns are to be aligned. The deformation of the lower structure occurs due to a factor during a process of manufacturing a semiconductor device. As a result, progressive misalignment may occur, in which an actual pattern position of patterns of the lower structure is changed from an original layout. The position correction may not change a shape of a pattern on which the optical proximity correction is performed, but move a position thereof.

Final design layout data, corrected by the optical proximity correction and the position correction, may be transferred to exposure equipment for manufacturing a mask for a lithography process such as a photomask and an electron beam mask.

The manufacturing of a mask using the corrected design layout (S300) may be manufacturing a mask according to the corrected design layout data. An exposure process is performed on a mask substrate using the corrected design layout data, to manufacture a mask. After the exposure process, for example, a series of processes such as development, etching, cleaning, baking, and the like, may be further performed to form the mask. According to example embodiments, before the corrected design layout data is transferred, verification for the corrected design layout data may be further performed.

The manufacturing of a semiconductor device using a mask (S400) may include performing a lithography process using the mask. The semiconductor device may include a volatile memory such as a dynamic random access memory (DRAM) and a static random access memory (SRAM), or a non-volatile memory such as a flash memory, and may include a logic semiconductor device such as a microprocessor, for example, a central processing unit (CPU), a controller, or an application specific integrated circuit (ASIC). In detail, the semiconductor device may be manufactured by forming second repetitive patterns on a lower structure including first repetitive patterns. The second repetitive patterns may be aligned in high accuracy with the first repetitive patterns by the mask. The semiconductor device may be ultimately manufactured by further performing a deposition process, an etching process, an ion implantation process, a cleaning process, and the like, in addition to the lithography process.

Figure 2:
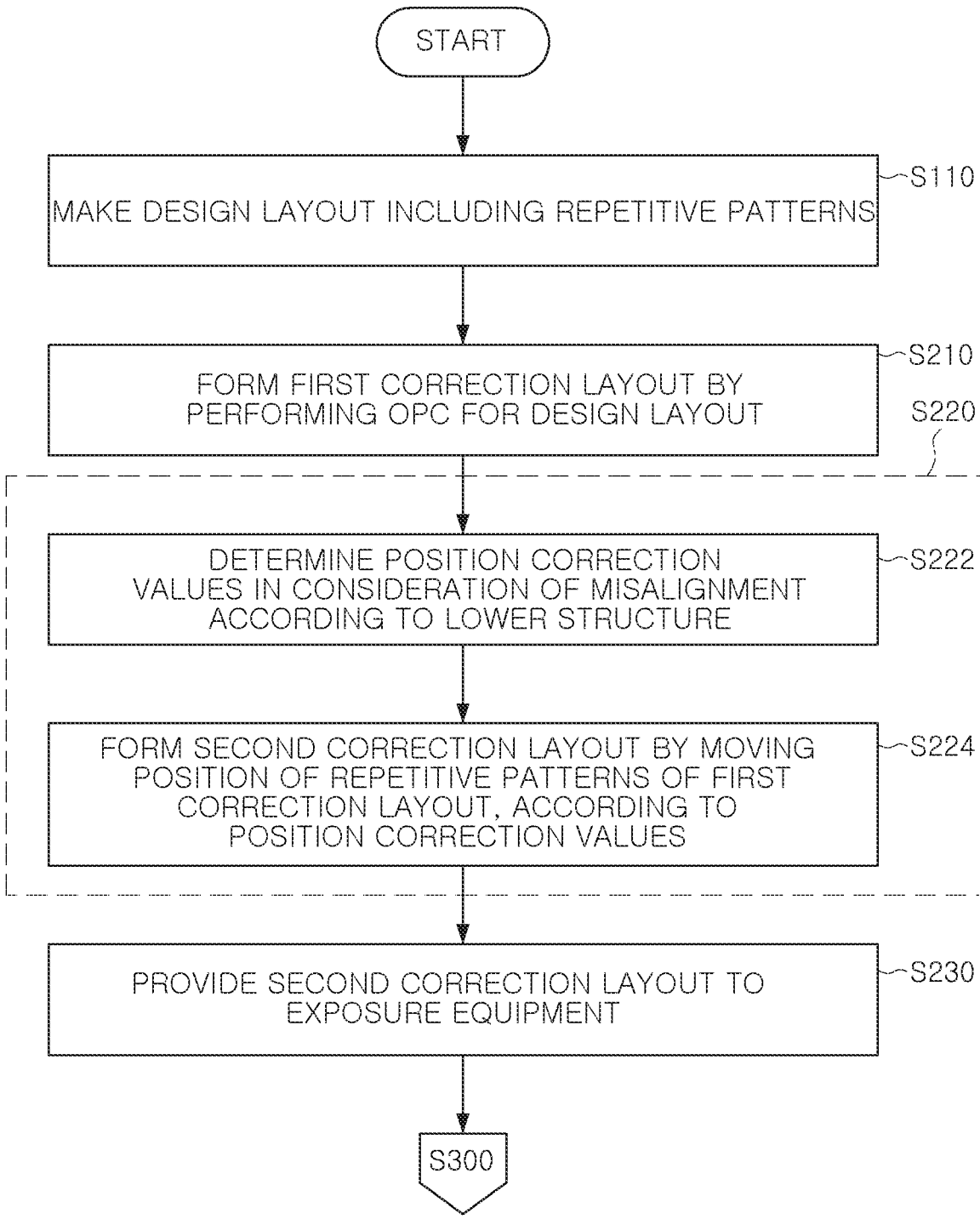
FIG. 2 is a flow diagram illustrating a mask design method according to example embodiments.

FIG. 2 is a flow diagram illustrating a mask design method according to example embodiments. In FIG. 2, a portion of the method of manufacturing a semiconductor device of FIG. 1 is illustrated in detail. Particularly, a mask design method in some example embodiments in which a design layout includes repetitive patterns is illustrated.

Referring to FIG. 2, a mask design method may include designing of a design layout including repetitive patterns (S110), forming of a first correction layout including corrected repetitive patterns by performing optical proximity correction for the design layout (S210), forming of a second correction layout by performing position correction to move a position of the corrected repetitive patterns with respect to the first correction layout (S220), and providing of the second correction layout to exposure equipment (S230). Thereafter, the manufacturing of a mask (S300), described previously with reference to FIG. 1, is performed in the same manner to manufacture a semiconductor device. Hereinafter, descriptions overlapping those with reference to FIG. 1 will be omitted.

The description of the designing of a design layout (S100), described previously with reference to FIG. 1, may be equally applied to the designing of a design layout including repetitive patterns (S110). However, in some example embodiments, in which the design layout includes repetitive patterns which are regularly arranged. The repetitive patterns may be patterns for formation of a configuration of a memory cell of a semiconductor device, by way of example. In detail, the repetitive patterns may be vertical channel patterns or contact plug patterns of a memory cell. The repetitive patterns may be patterns corresponding to repetitive patterns of a lower structure on a one by one basis in particular, but are not limited thereto.

The forming of a first correction layout including corrected repetitive patterns by performing optical proximity correction for the design layout (S210) may be, as described above, an operation in which patterns included in the design layout are changed by reflecting an error according to the optical proximity effect (OPE).

The forming of a second correction layout by performing position correction to move a position of the corrected repetitive patterns with respect to the first correction layout (S220) may include determining of position correction values in consideration of misalignment due to a lower structure (S222) and the forming of a second correction layout by moving a position of the corrected repetitive patterns of the first correction layout according to the position correction values (S224). The position correction values may be determined in consideration of physical changes occurring in a lower structure in which the repetitive patterns are formed, for example, expansion, contraction, warpage, or the like, of the lower structure. The position correction values may be determined in consideration of a temperature of processes in which the lower structure is formed and a coefficient of thermal expansion of materials forming the lower structure, and may also be determined by simulation based on real data. The second correction layout is obtained by only moving a position of the corrected repetitive patterns of the first correction layout, so a shape of each of the corrected repetitive patterns in the second correction layout may be the same as that in the first correction layout.

The providing of the second correction layout to exposure equipment (S230) may be ultimately transferring the corrected design layout data to exposure equipment, in order to manufacture a mask.

Figure 3A:
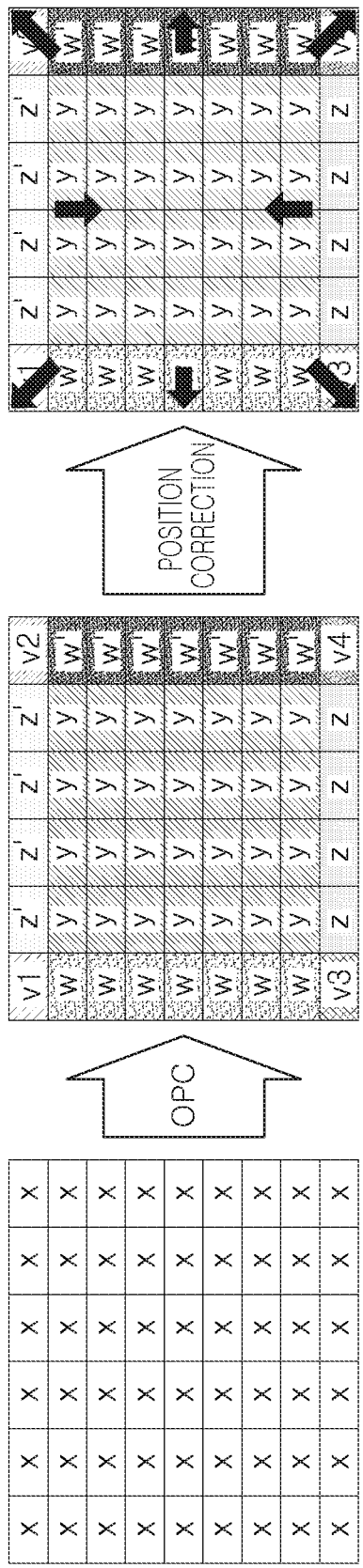
FIGS. 3A and 3B are views illustrating a mask design method according to example embodiments.
Figure 3B:
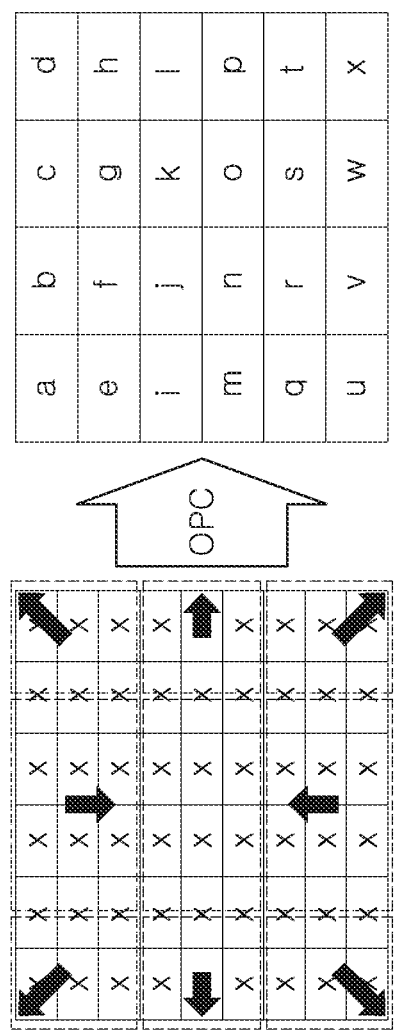

FIGS. 3A and 3B are views illustrating a mask design method according to example embodiments.

Referring to FIGS. 3A and 3B, a mask design method according to each of an Example and a Comparative Example will be schematically illustrated. First, as illustrated in FIG. 3A, relating to the Example, optical proximity correction may be first performed on repeated patterns x. This may correspond to the forming of a first correction layout (S210) of FIG. 2. The patterns x have a regularly repeated form. Thus, on most patterns except for patterns in an edge region, for example, more than half of patterns, the optical proximity correction may be performed repeatedly. Thus, some patterns including patterns in a central region are equally corrected to form first patterns y having the same shape. The patterns in an edge region may be slightly differently corrected depending on the surrounding environment during the optical proximity correction. Thus, the patterns in an edge region may be corrected to be different from the first patterns y, thereby forming second to ninth patterns w, w', z, z', v1, v2, v3, and v4. In this operation, optical proximity correction is repeatedly performed on most patterns, including patterns in a central region, in a similar manner, so the time for the optical proximity correction may be significantly reduced, and a result may be obtained uniformly.

Next, position correction considering the alignment of the lower structure may be performed. This may correspond to the forming of a second correction layout (S220) of FIG. 2. Regarding the position correction, a grid for dividing a design layout including patterns into a predetermined size, for example, about 0.01 nm to about 1 nm, is defined, and the position correction may be continuously performed for the grid. Alternatively, a region may be divided into a plurality of regions, and the position correction may be performed for each region. Position correction values, referring a direction of position correction and an amount of position correction, may be applied differently according to a position of the patterns.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

As illustrated in FIG. 3B, relating to Comparative Example, first, a region of patterns x to be a target of optical proximity correction is divided and position correction may be performed. The position correction, considering alignment with a lower structure, may be performed on patterns x on which optical proximity correction is not yet performed. Then, optical proximity correction may be performed on patterns x on which the position correction is performed. In some example embodiments, due to first performed position movement, repeatability of the patterns x is broken. In some example embodiments, during optical proximity correction, repeatability could not be recognized. Thus, optical proximity correction is performed on randomly divided regions (a, b, c . . . ). Thus, in a different manner from optical proximity correction for a repetitive pattern as described previously with reference to FIG. 3A, while each of patterns is provided as an independent target, optical proximity correction may be performed using a different method.

In some example embodiments, the time taken to perform optical proximity correction is relatively long, resulting in lowered uniformity as compared with the Example. In detail, in some example embodiments, the optical proximity correction is performed after defining a grid for dividing a design layout including position corrected patterns into a predetermined size, and the optical proximity correction is continuously performed for the grid. Here, a numerical error, generated by a size of the grid described above, is greater than an error allowed in a real semiconductor process. Moreover, it was confirmed that the numerical error is greater than a numerical error according to a position correction method as an example embodiment of FIG. 3A. Thus, according to the Comparative Example, when a semiconductor device is manufactured, dispersion of critical dimensions of photoresist patterns may be increased. In contrast, according to the Example described above, optical proximity correction on repetitive patterns is performed using repeatability of patterns, so the problem described above may be prevented. Thus, improvement of misalignment caused by position correction may be efficiently obtained.

Figure 4:
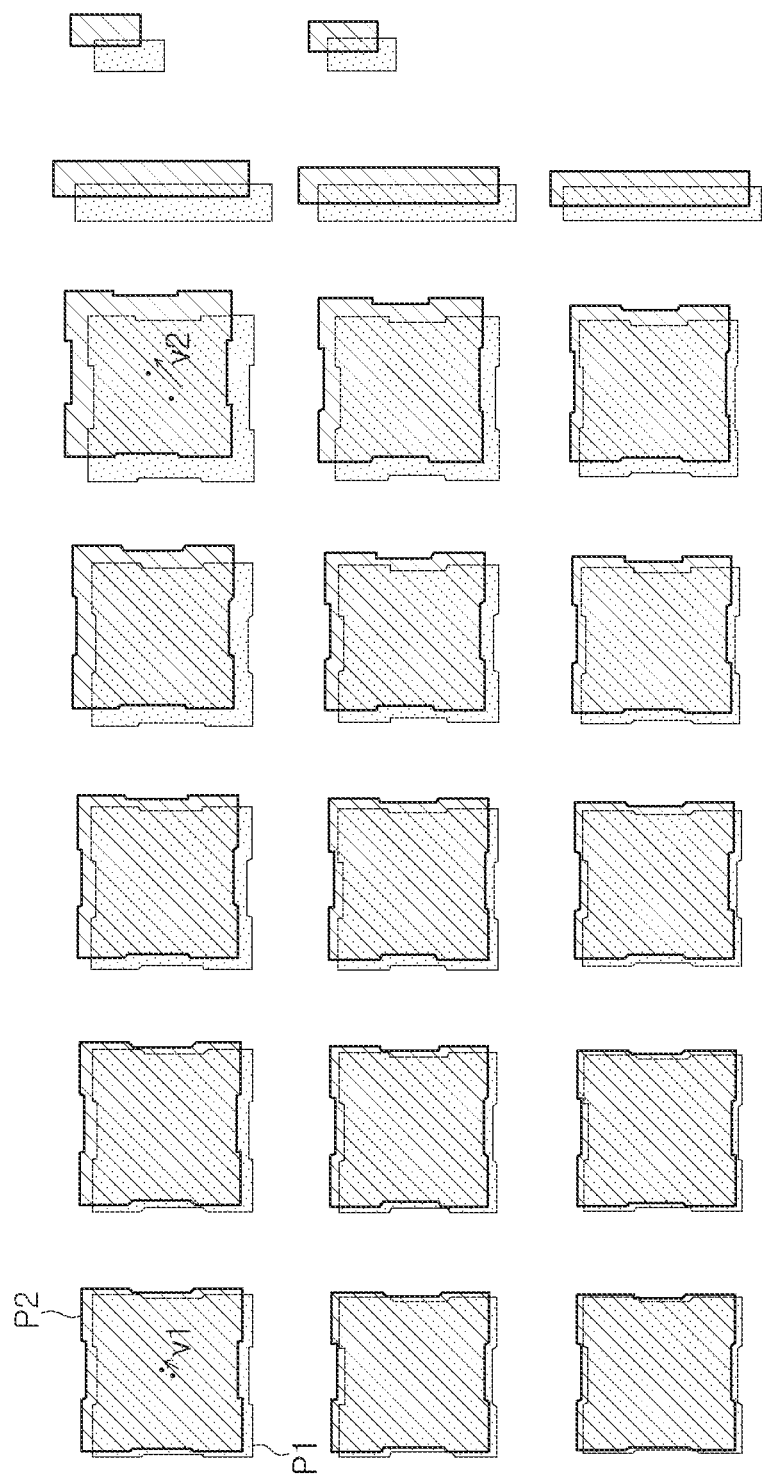
FIGS. 4 and 5 are views illustrating a mask design method according to example embodiments.
Figure 5:
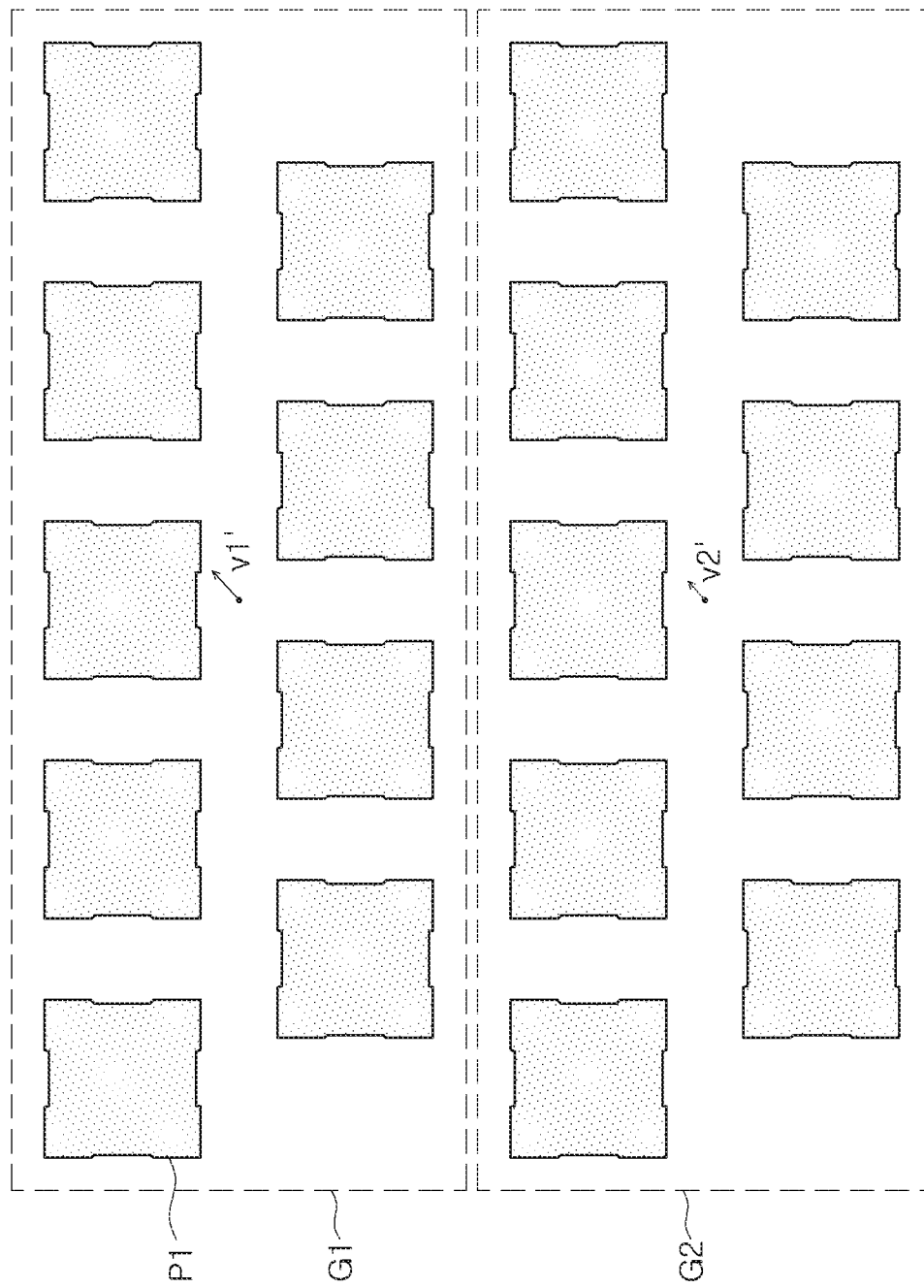

FIGS. 4 and 5 are views illustrating a mask design method according to example embodiments.

Referring to FIGS. 4 and 5, in the forming of a second correction layout (S220) of FIG. 2, example embodiments of a method to move a position of repetitive patterns will be schematically illustrated. First, as illustrated in FIG. 4, continuous coordinates are set with respect to repetitive patterns P1 of a first correction layout, and position correction values may be imparted to respective coordinates. For example, the coordinates may be determined in a unit of a grid size of the first correction layout data, and the position correction values may be given as a vector having a direction and a magnitude. According to a position correction value with respect to respective coordinates, edges of respective repetitive patterns P1 are moved to form final patterns P2. In some example embodiments, a position of the edges may be moved substantially continuously. In the final patterns P2, a position correction value v1 with respect to a first pattern may be different from a position correction value v2 with respect to a second pattern. As described above, when an edge is moved, position correction could be performed continuously, so accuracy may be improved. However, in some example embodiments, the first correction layout can be divided into a plurality of regions, and position correction may be performed continuously as described above in respective regions.

As illustrated in FIG. 5, according to example embodiments, repetitive patterns P1 are grouped in a regularly repeat unit to define a plurality of groups G1 and G2, a representative coordinate is determined with respect to each of the plurality of groups G1 and G2, position correction values v1' and v2' are imparted with respect to the representative coordinate, and edges of the repetitive patterns P1 may be moved according to the position correction values v1' and v2' for each of the plurality of groups G1 and G2. The plurality of groups G1 and G2 may be provided as a repeating unit having a predetermined size, and it does not necessarily have to be a minimum repeated unit. Moreover, the groups may be variously selected in consideration of a size, a category, and the like, of the pattern P1. The representative coordinate of each of the plurality of groups G1 and G2 may be a center coordinate of each of the groups G1 and G2, but is not limited thereto.

As described above, when using a method of moving an edge continuously or in a unit of a group, in comparison with some example embodiments in which a polygon of each pattern P1 is cut and moved, position correction could be continuously performed, so accuracy may be improved. For example, occurrence of an error may be significantly reduced, such as violation occurring during verification of whether a mask could be patternable.

Figure 6:
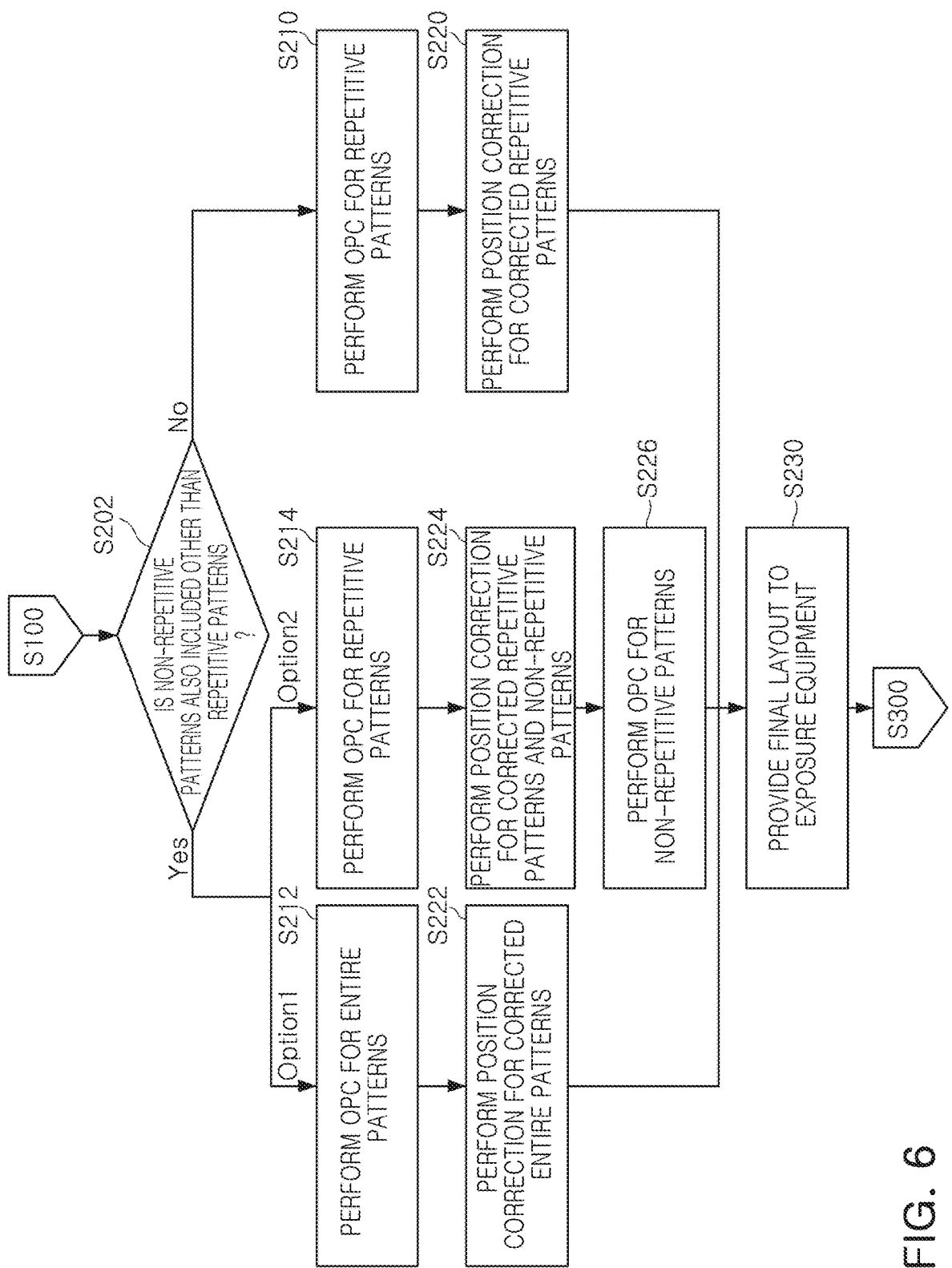
FIG. 6 is a flow diagram illustrating a mask design method according to example embodiments.

FIG. 6 is a flow diagram illustrating a mask design method according to example embodiments. In FIG. 6, particularly, a mask design method in consideration of some example embodiments in which a design layout includes non-repetitive patterns in addition to repetitive patterns is illustrated.

Figure 7A:
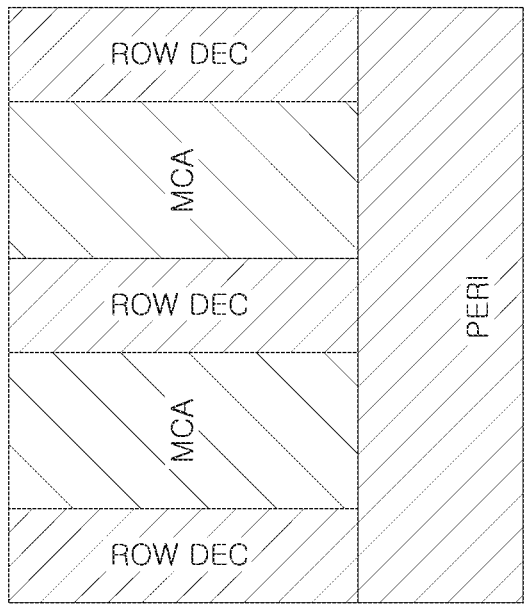
FIGS. 7A and 7B are views illustrating a mask design method according to example embodiments.
Figure 7A:
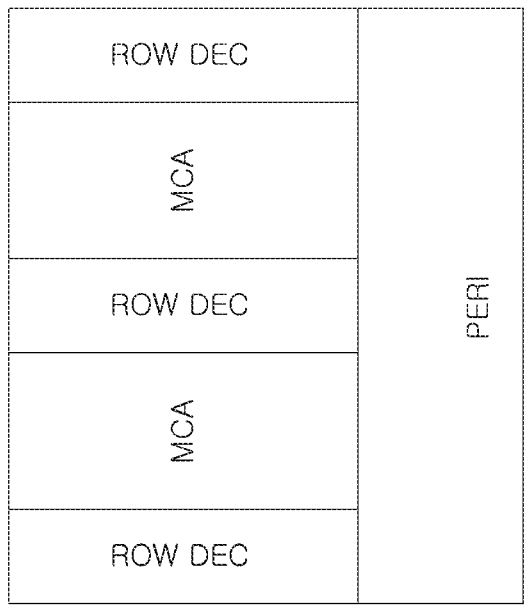
Figure 7A:
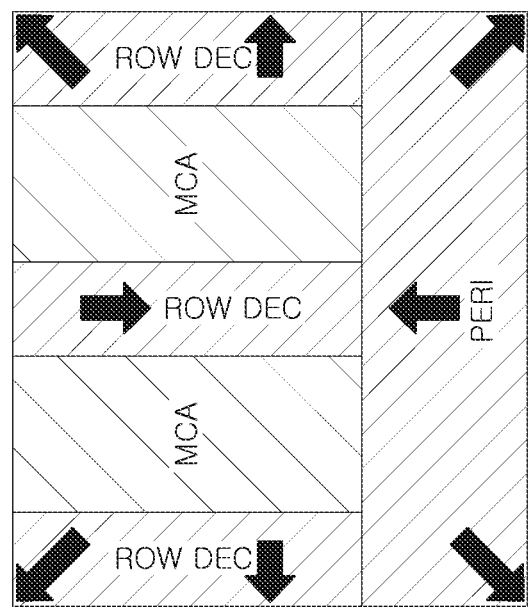
Figure 7B:
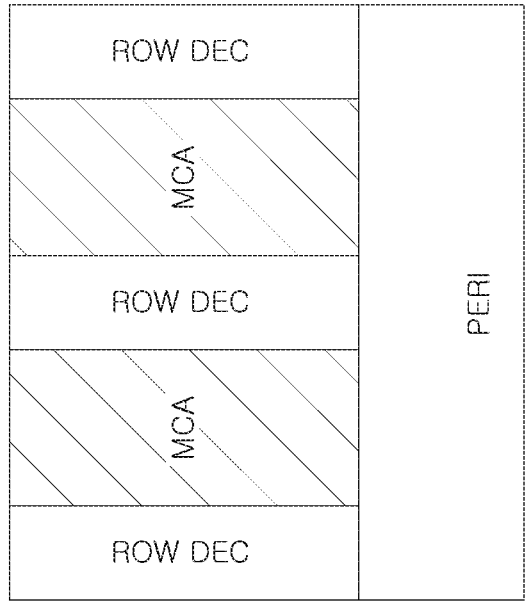
Figure 7B:
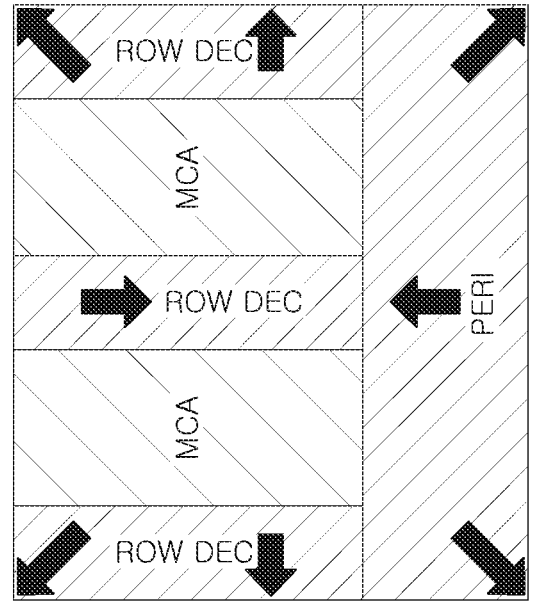
Figure 7B:
Figure 7B:
Figure 7B:
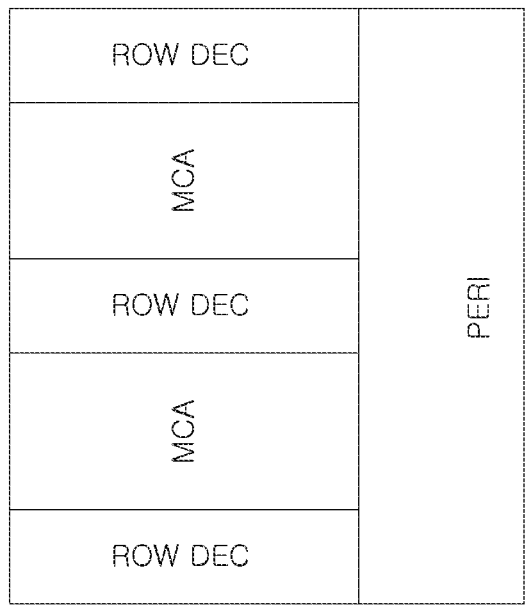
Figure 7B:
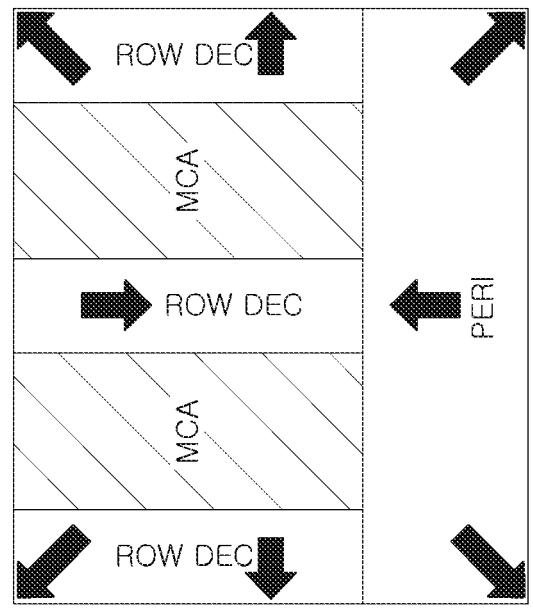
Figure 7B:

FIGS. 7A and 7B are views illustrating a mask design method according to example embodiments. FIGS. 7A and 7B schematically illustrate regions of a semiconductor device including repetitive patterns and non-repetitive patterns.

First, referring to FIG. 6, a mask design method may include determining of whether a design layout includes non-repetitive patterns in addition to repetitive patterns (S202). When the design layout does not include non-repetitive patterns, as described above with reference to FIG. 2, optical proximity correction is performed on repetitive patterns (S210), and position correction is performed on the corrected repetitive patterns (S220). When the design layout includes non-repetitive patterns, as described below, mask design may be performed according to two options.

First, according to a first option, performing of optical proximity correction on entire patterns including repetitive patterns and non-repetitive pattern (S212) and performing of position correction on the corrected entire patterns (S222) may be performed. As illustrated in FIGS. 7A and 7B, a semiconductor device may include memory cell regions MCA including repetitive patterns, row decoder regions ROW DEC and a peripheral circuit region PERI including non-repetitive patterns. In FIGS. 7A and 7B, hatching with respect to the regions indicates performing optical proximity correction, and an arrow indicates performing position correction. As illustrated in FIG. 7A, according to the first option, first, optical proximity correction may perform with respect to the entire patterns. The optical proximity correction may be performed on each of repetitive patterns and non-repetitive patterns, and then those are may be merged. On repetitive patterns, as described above with reference to FIG. 3A, first optical proximity correction of repeatedly performing optical proximity correction on patterns may be performed. On non-repetitive patterns, in a manner different from some example embodiments of the repetitive patterns, each pattern is provided as a target and second optical proximity correction may be performed, as described above with reference to FIG. 3B. Next, on entire patterns on which optical proximity correction is performed, position correction may be performed.

Next, according to a second option, performing of optical proximity correction on repetitive patterns (S214), performing of position correction on the corrected repetitive patterns and non-repetitive patterns (S224), and performing of optical proximity correction on the non-repetitive patterns (S226) may be performed. As illustrated in FIG. 7B, first, on repetitive patterns of the memory cell regions MCA, optical proximity correction may be performed. On repetitive patterns, as described above with reference to FIG. 3A, first optical proximity correction of repeatedly performing optical proximity correction on patterns may be performed. Then, on the corrected repetitive patterns together with non-repetitive patterns on which optical proximity correction is not performed, position correction may be performed. Ultimately, on the non-repetitive patterns, on which position correction is performed, optical proximity correction may be performed. On the non-repetitive patterns, as described above with reference to FIG. 3B, each pattern is provided as a target and second optical proximity correction may be performed.

Thereafter, providing of a final layout, described above with reference to FIG. 2, to exposure equipment (S230), and subsequent operations of FIG. 1 are performed in the same manner to manufacture a semiconductor device.

Figure 8:
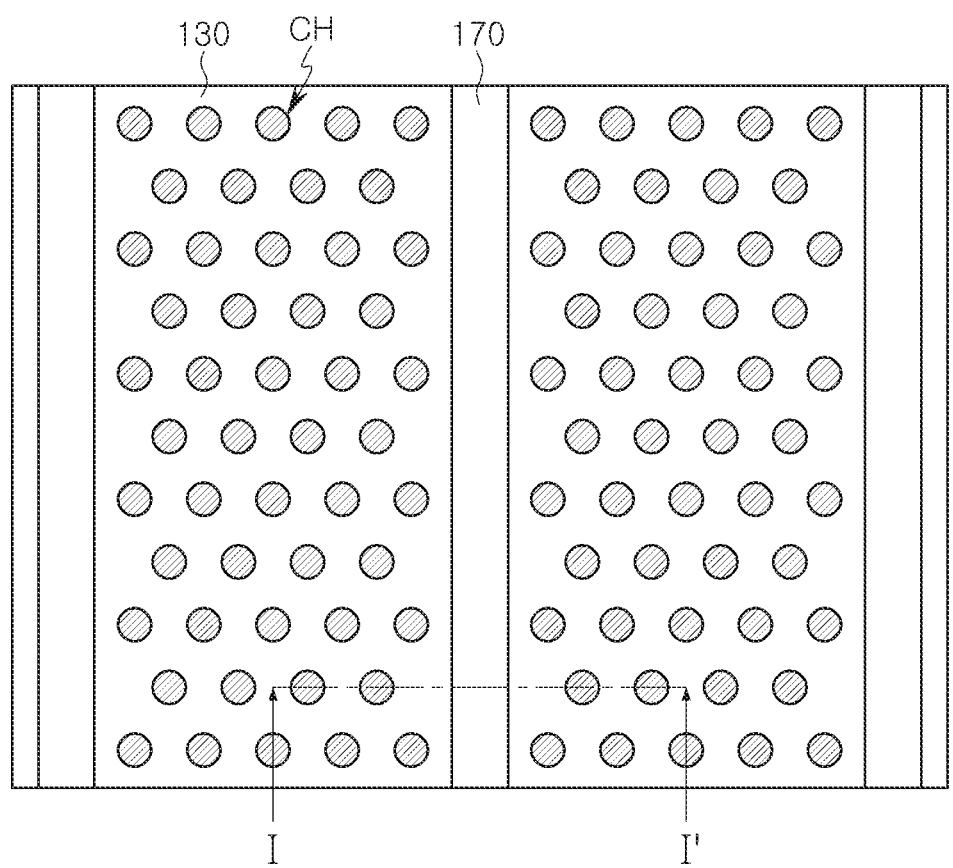
FIG. 8 is a schematic plan view of a semiconductor device according to example embodiments.

FIG. 8 is a schematic plan view of a semiconductor device according to example embodiments.

Figure 9:
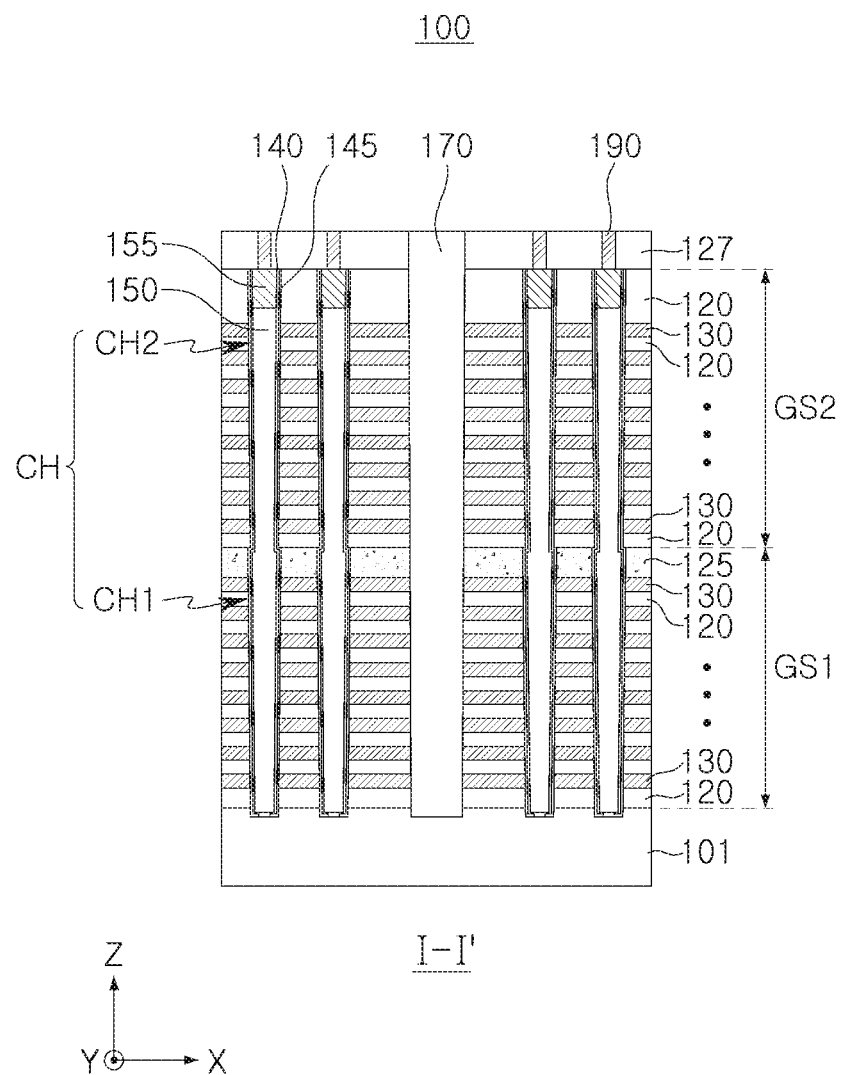
FIG. 9 is a schematic cross-sectional view illustrating a semiconductor device according to example embodiments.

FIG. 9 is a schematic cross-sectional view illustrating a semiconductor device according to example embodiments. FIG. 9 illustrates a cross-section of the semiconductor device of FIG. 8, taken along line I-I'. For convenience of explanation, only main components of a semiconductor device are illustrated in FIGS. 8 and 9.

Referring to FIGS. 8 and 9, a semiconductor device 100 may include a substrate 101, first and second gate structures GS1 and GS2 disposed on the substrate 101 and including gate electrodes 130, channel structures CH extended in a direction perpendicular to an upper surface of the substrate 101, passing through the first and second gate structures GS1 and GS2, and having a channel layer 140 disposed therein, and a separation region 170 extended while passing through the first and second gate structures GS1 and GS2. Moreover, the semiconductor device 100 may further include a first insulating layer 125 on an uppermost portion of the first gate structure GS1, a second insulating layer 127 on the second gate structure GS2, and contact plugs 190 passing through the second insulating layer 127 and connected to the channel structures CH. Each of the channel structures CH may include a gate dielectric layer 145 disposed between the channel layer 140 and the gate electrodes 130, a channel insulating layer 150 disposed inside the channel layer 140, and channel pads 155 in an upper end of the channel structures CH, in addition to the channel layer 140.

In the semiconductor device 100, a single memory cell string may be provided around each of the channel structures CH, and the plurality of memory cell strings may be arranged in rows and columns in the x-direction and the y-direction.

The substrate 101 may contain a semiconductor material, for example, a group IV semiconductor, a group III-V compound semiconductor, or a group II-VI oxide semiconductor.

The channel structures CH may be spaced apart from each other in rows and columns on the substrate 101. The channel structures CH may have a form in which first channel structures CH1 of the first stacked structure GS1 and second stacked structures CH2 of the second gate structure GS2 are connected to each other, and may have a bent portion due to a difference in widths in a connection region. In the channel structures CH, the channel layer 140 may have an annular form surrounding the channel insulating layer 150, formed therein. However, the channel layer may have a columnar shape without the channel insulating layer 150, such as a cylinder or a prism, according to some example embodiments. According to example embodiments, the channel layer 140 may be directly connected to the substrate 101 in a lower portion, or may be electrically connected to the substrate 101 by a separate epitaxial layer disposed below. The channel layer 140 may contain a semiconductor material such as polycrystalline silicon or single crystalline silicon, and the semiconductor material may be a material undoped with an impurity, or a material containing p-type or n-type impurities. The channel structures CH, arranged in a straight line in the x-direction may be connected to bit lines, different from each other, by arrangement of an upper wiring structure connected to the channel pad 155. The gate dielectric layer 145 may be disposed between the gate electrodes 130 and the channel layer 140. The gate dielectric layer 145 may include a tunneling layer, an electric charge storage layer, and a blocking layer sequentially disposed from the channel layer 140. The channel pads 155 are disposed on an upper portion of the channel layer 140, and may be disposed to be electrically connected to the channel layer 140 while covering an upper surface of the channel insulating layer 150. The channel pads 155 may include, for example, doped polycrystalline silicon. The channel structures CH may correspond to the repetitive patterns, and/or the non-repetitive patterns discussed above.

The gate electrodes 130 may be spaced apart from each other in a direction perpendicular to the substrate 101 along a side surface of each of the channel structures CH. Each of the gate electrodes 130 may form a gate electrode of a ground select transistor, a plurality of memory cells, and a string select transistor. The gate electrodes 130 may extend while forming a ground select line, word lines, and a string select line, while the word lines may be commonly connected to adjacent memory cell strings arranged in a predetermined unit in the x- and y-directions.

The separation region 170 may be extended in a direction while passing through the first and second stacked structures GS1 and GS2. The separation region 170 may only include an insulating material, or may include an insulating material and a conductive material.

In the semiconductor device 100, the second channel structures CH2 arranged on the first channel structures CH1 in a lower portion, and/or contact plugs 190 arranged on the second channel structures CH2 may be formed using a mask manufactured by the mask design method described above with reference to FIGS. 2 to 7B. This will be described below in more detail with reference to FIGS. 10A to 11B.

FIGS. 10A to 10F are schematic cross-sectional views illustrating a method of manufacturing a semiconductor device according to example embodiments. FIGS. 10A to 10F illustrate a cross-section corresponding to FIG. 9.

Figure 11A:
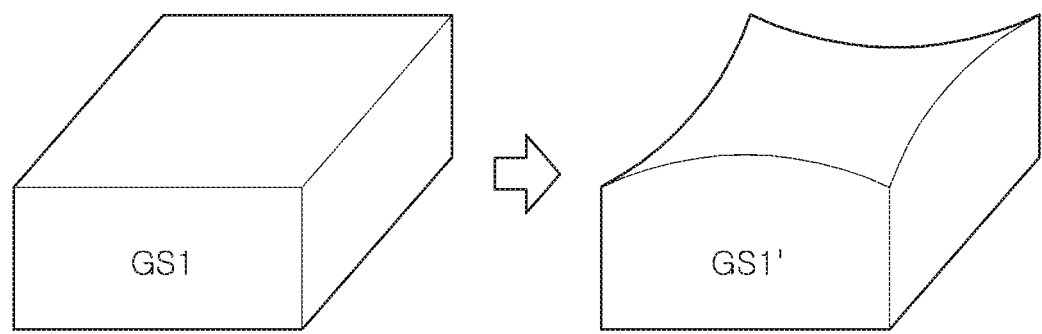
FIGS. 11A and 11B are schematic views illustrating deformation occurring in a lower structure, during manufacturing of a semiconductor device according to example embodiments.

FIGS. 11A and 1B are schematic views illustrating deformation occurring in a lower structure, during manufacture of a semiconductor device according to example embodiments.

Figure 10A:
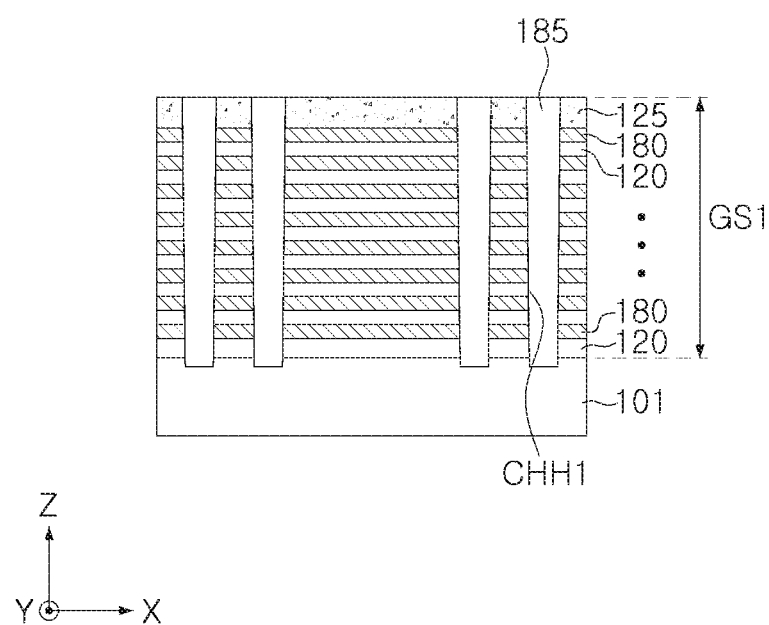
FIGS. 10A to 10F are schematic cross-sectional views illustrating a method of manufacturing a semiconductor device according to example embodiments.

Referring to FIG. 10A, sacrificial layers 180 and interlayer insulating layers 120 are alternately stacked on the substrate 101 to form the first stacked structure GS1, the first channel holes CHH1 passing through the first stacked structure GS1 are formed, and the channel sacrificial layers 185 are formed by filling first channel holes CHH1.

The sacrificial layers 180 may be a layer to be replaced with gate electrodes 130 through a subsequent process. The sacrificial layers 180 may be formed of a material to be etched with etching selectivity for the interlayer insulating layers 120 and the first insulating layer 125. The first insulating layer 125 may be formed on an uppermost portion. However, according to example embodiments, the first insulating layer 125 may be disposed in a lower portion of the second stacked structure GS2. The thicknesses of the interlayer insulating layers 120 and the sacrificial layers 180 and the number of films forming the same may be variously changed from those illustrated in the drawings. The channel sacrificial layers 185 may be formed of a material to be etched with etching selectivity for the sacrificial layers 180 and the interlayer insulating layers 120. For example, the channel sacrificial layers 185 may include silicon (Si).

Figure 10B:
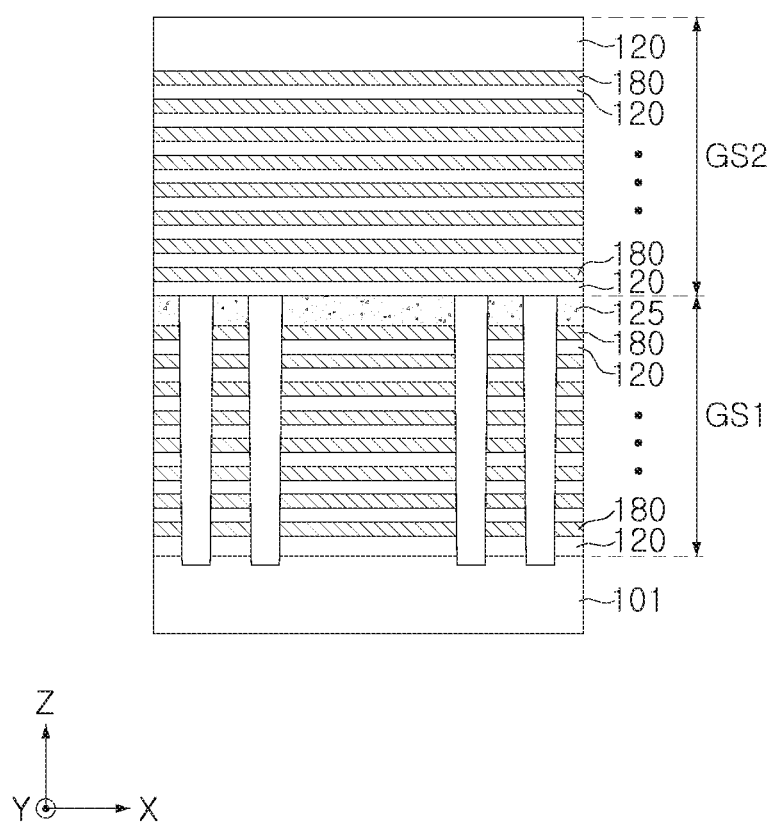

Referring to FIG. 10B, sacrificial layers 180 and interlayer insulating layers 120 are alternately stacked on the first stacked structure GS1 to form the second stacked structure GS2.

The second stacked structure GS2 may be formed by stacking sacrificial layers 180 and interlayer insulating layers 120 on the first insulating layer 125 and the channel sacrificial layers 185, in a similar manner to the first stacked structure GS1.

Figure 10C:
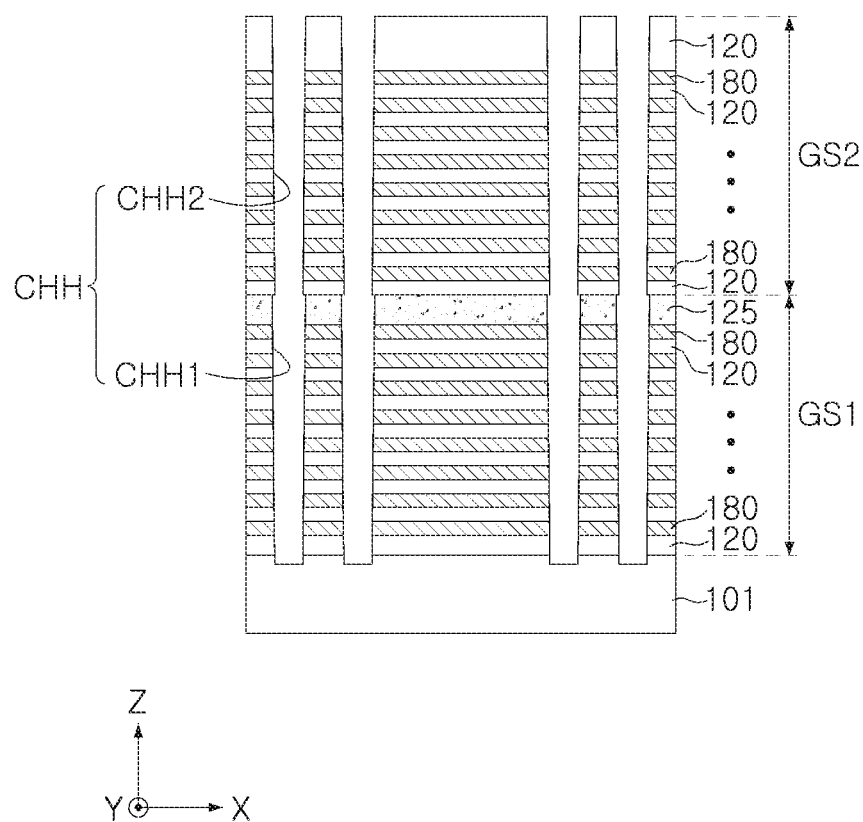

Referring to FIG. 10C, second channel holes CHH2 passing through a second stacked structure GS2 are formed, and channel sacrificial layers 185 in the first channel holes CHH1 may be removed therefrom.

First, the second channel holes CHH2 may be formed to be aligned with the first channel holes CHH1, respectively. In detail, a photoresist layer is patterned to expose a portion of the second stacked structure GS2 on the second stacked structure GS2, and then the second stacked structure GS2 is etched to form the second channel holes CHH2 in an exposed region. In this operation, the photoresist layer may be formed by performing a lithography process using a mask manufactured using the mask design method described above with reference to FIGS. 2 to 7B, by way of example.

Figure 11B:
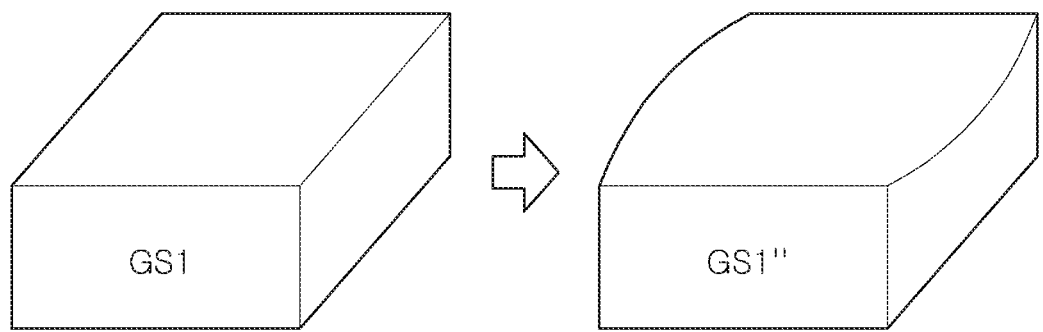

As illustrated in FIGS. 11A and 11B, while the first stacked structure GS1 is subjected to a plurality of operations, due to a processing temperature and a difference in a coefficient of thermal expansion between different materials forming the first stacked structure GS1, expansion or contraction, distortion, warpage, or the like, occurs, so the first stacked structure GS1 may be deformed to be a first stacked structure GS1'. In some example embodiments, in this operation, it may be difficult to align the second channel holes CHH2 to correspond to the first channel holes CHH1, respectively. However, as described above, in a mask manufactured according to example embodiments, not only optical proximity correction but also position correction is performed on patterns for formation of the second channel holes CHH2. Thus, second channel holes CHH2 may be aligned in high accuracy with the first channel holes CHH1 of the stacked structure GS1' deformed as described above.

Then, channel sacrificial layers 185, exposed by the second channel holes CHH2, are removed to form channel holes CHH in which the first channel holes CHH1 and the second channel holes CHH2 are connected.

Figure 10D:
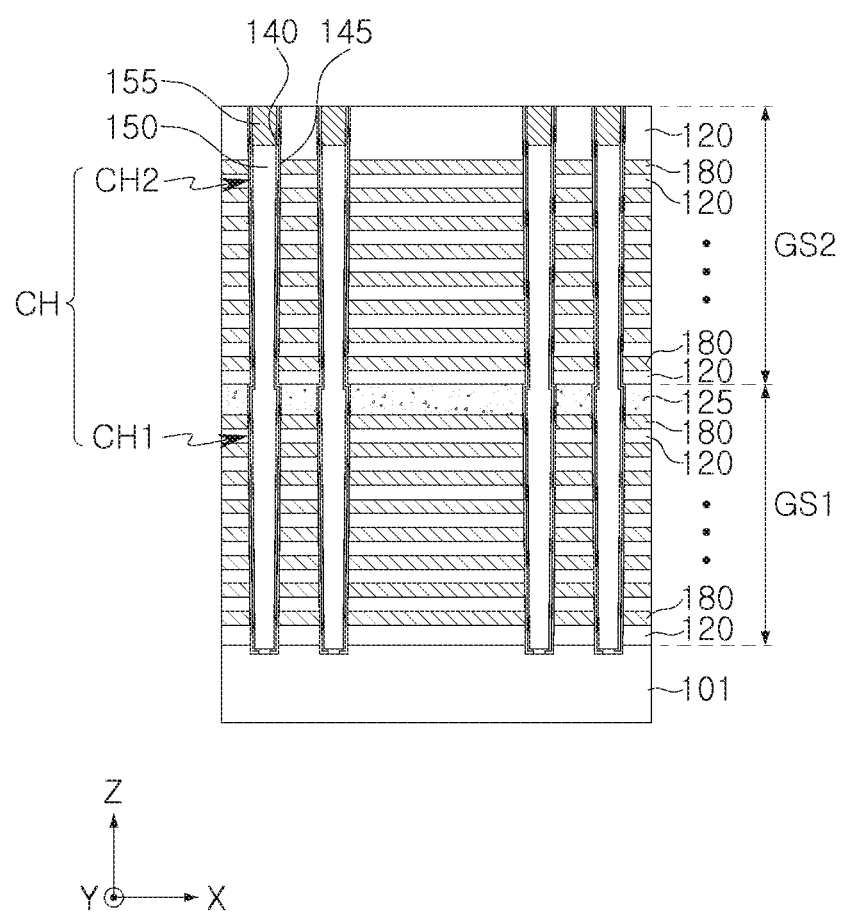

Referring to FIG. 10D, channel structures CH including first and second channel structures CH1 and CH2 may be formed.

The channel structures CH may be provided to have a form in which each of the first and second channel structures CH1 and CH2 are connected to each other to form a single structure. The channel structures CH may be formed by forming at least a portion of the gate dielectric layer 145, the channel layer 140, the channel insulating layer 150, and the channel pads 155 in the channel holes CHH.

The gate dielectric layer 145 may have a uniform thickness using atomic layer deposition (ALD) or chemical vapor deposition (CVD). In this operation, the gate dielectric layer 145 may be formed in whole or in part, and a portion of the gate dielectric layer may be formed to be extended perpendicular to the substrate 101 along the channel structures CH. The channel layer 140 may be formed on the gate dielectric layer 145 in the channel structures CH. The insulating layer 150 may be formed to fill the channel structures CH, and may be an insulating material. The channel pad 155 may be formed of a conductive material, for example, polycrystalline silicon.

Figure 10E:
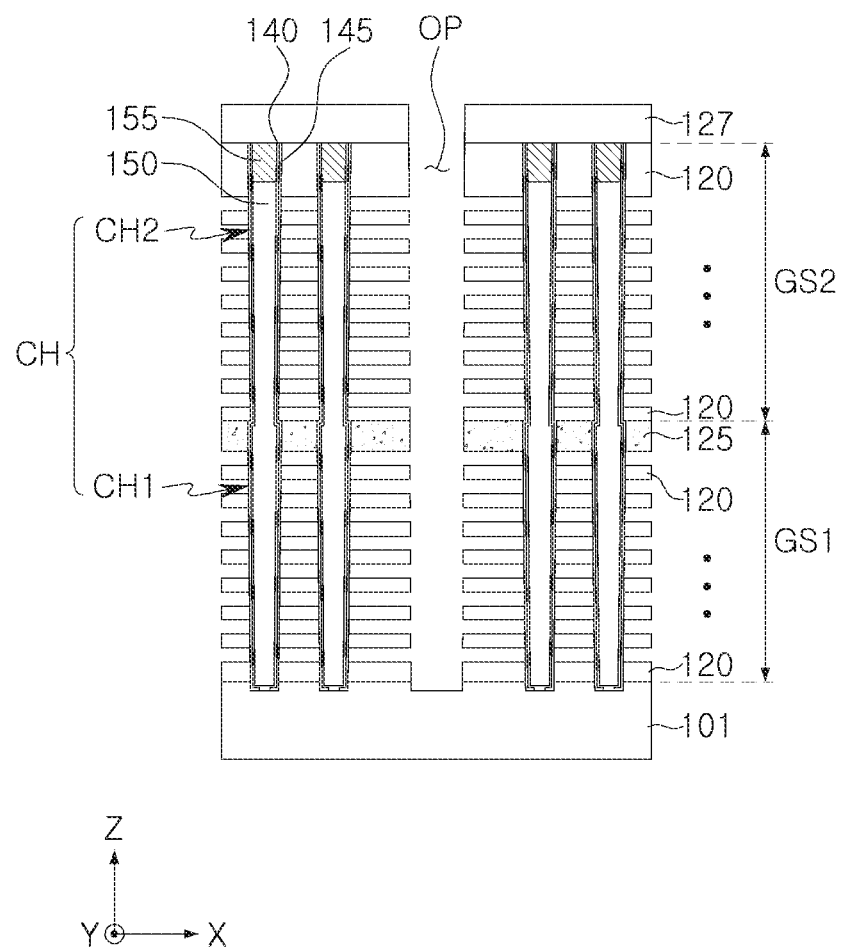

Referring to FIG. 10E, an opening OP passing through the first and second stacked structures GS1 and GS2 is formed, and sacrificial layers 180 may be removed through the opening OP.

First, before the opening OP is formed, in order to protect channel structures CH, a second insulating layer 127 may be further formed. The opening OP may be formed by forming a mask layer using a photolithography process, and anisotropically etching the first and second structures GS1 and GS2. The opening OP may be provided in the form of a trench extended in the y-direction. The substrate 101 may be exposed in a lower portion of the opening OP.

The sacrificial layers 180 may be removed selectively with respect to the interlayer insulating layers 120, using, for example, wet etching. Accordingly, a plurality of side openings may be formed between the interlayer insulating layers 120, and a portion of a side wall of the channel structures CH may be exposed through the side openings.

Figure 10F:
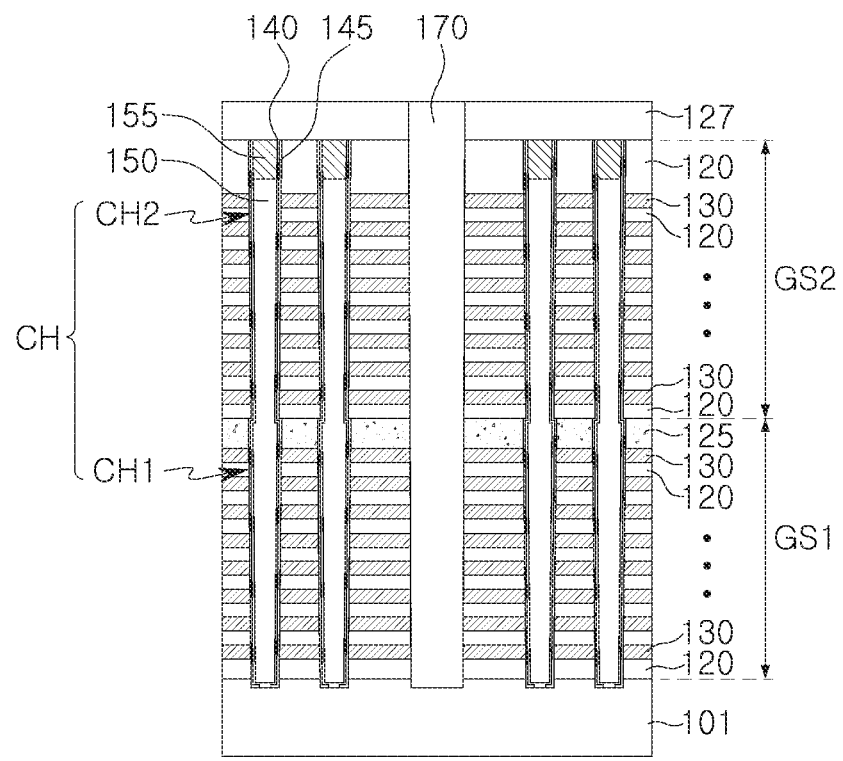

Referring to FIG. 10F, gate electrodes 130 are formed by filling a region from which the sacrificial layers 180 are removed with a conductive material, and a separation region 170 is formed by filling an opening OP.

The gate electrodes 130 may include a metal, polycrystalline silicon, or a metal silicide material. The opening OP may provide a transfer path of a material for formation of the gate electrodes 130. After the gate electrodes 130 are formed, a material forming the gate electrodes 130 deposited in the openings OP may be removed through an addition process.

The separation region 170 may be formed by filling the opening OP with at least one of an insulating material and a conductive material.

Next, referring to FIG. 9 together, contact holes passing through the second insulating layer 127 are formed, and a conductive material is embedded in the contact holes to form contact plugs 190.

The contact plugs 190 may be formed to be aligned with the channel structures CH, respectively. In detail, a photoresist layer is patterned to expose a portion of the second insulating layer 127 on the second insulating layer 127, and then the second insulating layer 127 is etched to form the contact holes in an exposed region. In this operation, the photoresist layer may be formed by performing a lithography process using a mask manufactured using the mask design method described above with reference to FIGS. 2 to 7B, by way of example.

As set forth above, according to example embodiments of the present inventive concept, position correction is performed after optical proximity correction is performed on repetitive patterns, so a mask design method with improved accuracy and efficiency and a method of manufacturing a semiconductor device using the same may be provided.

Although described with reference to specific examples and drawings, modifications, additions and substitutions of example embodiments may be variously made according to the description by those of ordinary skill in the art. For example, the described techniques may be performed in an order different with that of the methods described, and/or components such as the described circuit layout, and the like, may be connected or combined to be different from the above-described methods, or results may be appropriately achieved by other components or equivalents.

While example embodiments have been shown and described above, it will be apparent to those skilled in the art that modifications and variations could be made without departing from the scope of the present disclosure, as defined by the appended claims. Rather, the words used in the specification are words of description rather than limitation, and it is understood that various changes may be made without departing from the spirit and scope of the inventive concept of the present disclosure. Additionally, the features of various implementing embodiments may be combined to form further embodiments of the present disclosure

What is claimed is:

1. A method of manufacturing a semiconductor device, comprising:
    forming a lower structure including first repetitive patterns; and
    forming an upper structure including forming second repetitive patterns to correspond to each of the first repetitive patterns on the lower structure,
    wherein the forming second repetitive patterns includes
        preparing a design layout for the second repetitive patterns;
        forming a first correction layout including corrected second repetitive patterns by performing optical proximity correction (OPC) on the design layout;
        forming a second correction layout by performing position correction on the first correction layout to move a position of the corrected second repetitive patterns to correspond to a changed position of the first repetitive patterns according to physical deformation of the lower structure;
        manufacturing a mask using the second correction layout; and
        patterning a photoresist layer using the mask.

2. The method of manufacturing of claim 1, wherein the forming the second correction layout includes
    imparting position correction values to coordinates of the first correction layout; and
    moving respective edges of the corrected second repetitive patterns according to the position correction values.

3. The method of manufacturing of claim 1, wherein the forming the second correction layout includes
    defining a plurality of groups by grouping the corrected second repetitive patterns in a repeating unit;
    determining a representative coordinate with respect to each of the plurality of groups;

imparting a position correction value to the representative coordinate of each of the plurality of groups; and moving edges of each of the corrected second repetitive patterns according to the position correction value, for each of the plurality of groups.

4. The method of manufacturing of claim 3, wherein the representative coordinate is a center coordinate of each of the plurality of groups.

5. The method of manufacturing of claim 1, wherein the forming the first correction layout includes equally correcting at least a portion of the second repetitive patterns forming the design layout.

6. The method of manufacturing of claim 5, wherein equally correcting at least a portion of the second repetitive patterns forming the design layout includes correcting a portion of the second repetitive patterns, except the second repetitive patterns in an edge region, to the same shape by the optical proximity correction.

7. The method of manufacturing of claim 1, wherein the forming the second correction layout includes determining the changed position of the first repetitive patterns in consideration of a process temperature of processes in which the lower structure is formed and a coefficient of thermal expansion of materials forming the lower structure.

8. The method of manufacturing of claim 7, wherein expansion, contraction, or warpage of the lower structure change an initial position of the first repetitive patterns to the changed position of the first repetitive patterns.

9. The method of manufacturing of claim 1, wherein the forming the lower structure includes:

alternately stacking a first interlayer insulating layer and first sacrificial layers on a substrate; and forming first channel holes passing through the first interlayer insulating layer and the first sacrificial layers, and vertically extended on the substrate, the first repetitive patterns being the first channel holes.

10. The method of manufacturing of claim 9, wherein the forming the upper structure includes:

alternately stacking a second interlayer insulating layer and second sacrificial layers on the lower structure; and forming second channel holes passing through the second interlayer insulating layer and the second sacrificial layers, and vertically extended to be connected to the first channel holes, the second repetitive patterns being the second channel holes.

11. A method of manufacturing a semiconductor device, comprising:

preparing a design layout including repetitive patterns and non-repetitive patterns;

forming a first correction layout including corrected repetitive patterns by performing first optical proximity correction (OPC) on the repetitive patterns;

forming a second correction layout by performing first position correction on the first correction layout to move a position of the corrected repetitive patterns;

performing second optical proximity correction (OPC) on the non-repetitive patterns using a method different from the first optical proximity correction; and performing second position correction on the non-repetitive patterns to move a position of the non-repetitive patterns.

12. The method of manufacturing of claim 11, wherein the second position correction is performed on the non-repetitive patterns, after the second optical proximity correction is performed on the non-repetitive patterns.

13. The method of manufacturing of claim 12, wherein the first position correction is performed together with the second position correction.

14. The method of manufacturing of claim 11, wherein, the second optical proximity correction is performed on the non-repetitive patterns, after the second position correction is performed on the non-repetitive patterns.

15. The method of manufacturing of claim 14, wherein the first position correction is performed together with the second position correction.

16. The method of manufacturing of claim 11, wherein the repetitive patterns form a memory cell region including memory cells, and the non-repetitive patterns form a peripheral circuit region including circuits electrically connected to the memory cells.

17. A mask design method, comprising:

preparing a design layout including second repetitive patterns formed to match first repetitive patterns;

forming a first correction layout including corrected second repetitive patterns, by performing optical proximity correction (OPC) on the design layout;

forming a second correction layout by performing position correction on the first correction layout to move a position of the corrected second repetitive patterns to correspond to a change in position of the first repetitive patterns; and providing the second correction layout to exposure equipment.

18. The mask design method of claim 17, wherein the forming the second correction layout includes:

moving respective edges of the corrected second repetitive patterns according to position correction values.

19. The mask design method of claim 17, wherein, the forming the first correction layout includes equally correcting more than half of the second repetitive patterns.

20. The mask design method of claim 17, wherein, in the second correction layout, a shape of each of the corrected second repetitive patterns is the same as a shape of each of the corrected second repetitive patterns in the first correction layout.

* * * * *